United States Patent

Schultz et al.

[11] Patent Number: 5,995,401
[45] Date of Patent: Nov. 30, 1999

[54] LARGE-CAPACITY CONTENT ADDRESSABLE MEMORY

[75] Inventors: Kenneth James Schultz, Kanata; Garnet Frederick Randall Gibson, Nepean, both of Canada

[73] Assignee: Nortel Networks Corporation, Montreal, Canada

[21] Appl. No.: 09/074,653

[22] Filed: May 8, 1998

Related U.S. Application Data

[62] Division of application No. 08/748,928, Nov. 14, 1996, Pat. No. 5,828,593
[60] Provisional application No. 60/021,576, Jul. 11, 1996.
[51] Int. Cl.[6] .................................................. G11C 15/00
[52] U.S. Cl. ........................................ 365/49; 365/189.07
[58] Field of Search .................................. 365/49, 189.07

[56] References Cited

U.S. PATENT DOCUMENTS

| 5,592,407 | 1/1997 | Konishi et al. | 365/49 |
| 5,638,315 | 6/1997 | Braceras et al. | 365/49 |
| 5,715,188 | 2/1998 | Covino et al. | 365/49 |

*Primary Examiner*—Huan Hoang
*Attorney, Agent, or Firm*—Angela C. de Wilton

[57] ABSTRACT

A large-capacity CAM (content addressable memory) is disclosed. RAM core cells are used to store the CAM data. The comparison function is not performed in the core cells, but rather in comparators which are placed adjacent to a plurality of core cells, in such a way that the plurality of core cells shares access to a single comparator. Access to the comparator is shared by a time-division multiplexed means, requiring a plurality of serialized operations. These operations are self-timed and transparent to the user, because they occur in a single cycle of the externally-supplied clock.

1 Claim, 13 Drawing Sheets

FIG. 10A    FIG. 10C

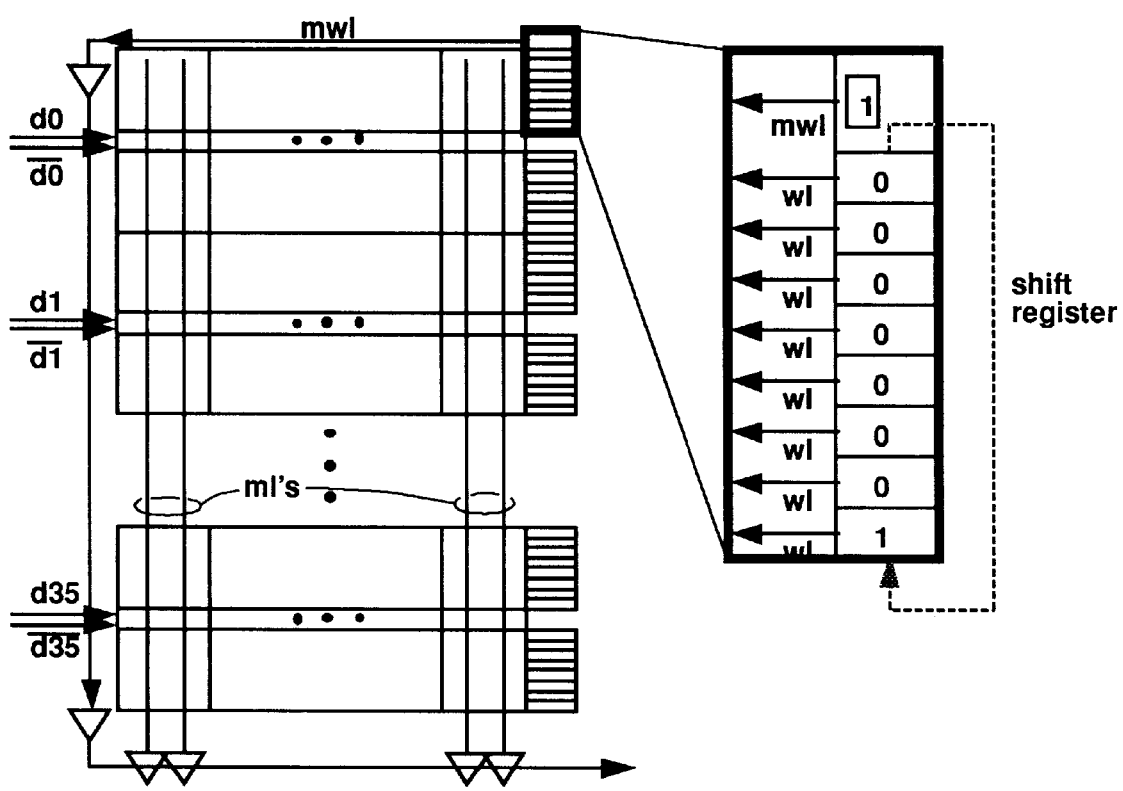
FIG. 11A  FIG. 11B

LARGE-CAPACITY CONTENT ADDRESSABLE MEMORY

This application is a division of application Ser. No. 08/748,928, filed Nov. 14, 1996, now U.S. Pat. No. 5,828,593, which claims the benefit of provisional application Ser. No. 60/021,576, filed Jul. 11, 1996.

FIELD OF THE INVENTION

The present invention relates to a content addressable memory.

BACKGROUND OF THE INVENTION

A typical content addressable memory (CAM) includes CAM storage elements (core cells) which include comparators therein, so as to perform the dual functions of storage of a bit of data and comparison of the stored bit to applied reference data. Recent prior art includes examples of employing RAM core cells and less than one comparator per storage bit.

U.S. Pat. No. 3,648,254 granted to W. F. Beausoleil on Mar. 7, 1972 discloses the implementation of a CAM using shift registers or other rotating media for storage. They are arranged in such a way as to function as a plurality of word-serial searches operating in parallel. It requires that the stored data rotate past the comparator logic, instead of being read from a RAM based on a rotating pointer.

U.S. Pat. No. 4,145,737 granted to S. M. Lamb et al. on Mar. 20, 1979 discloses the implementation of a CAM using RAM for storage. The comparators are a shared resource, but in a search operation, only one RAM location is selected from each block (the same across all blocks).

U.S. Pat. No. 4,622,653 granted to D. J. McElroy on Nov. 11, 1986 discloses a means of integrating comparators together with a DRAM, accessing all cells in a single row of the DRAM simultaneously (a row referred to as a "block"), thereafter comparing them to reference data, with multiple match lines provided for the multiple words in a physical row, and sequential access means for sequencing through all of the blocks that make up the memory.

U.S. Pat. No. 4,958,377 granted to K. Takahashi on Sep. 18, 1990 discloses many possible embodiments of an associative memory, in which data does not need to be explicitly compared, since the value of a bit is encoded in its position.

A paper by M. Motomura et al. entitled "A 1.2-Million Transistor, 33-MHz, 20-b Dictionary Search Processor (DISP) ULSI with a 160-kb CAM", IEEE Journal of Solid-State Circuits, Vol. 25, No. 5, pp. 1158–1165, October 1990, describes a means of sharing a comparator among multiple SRAM cells using categorization, such that a search is completed in a single cycle, but only one of these SRAM cells is actually compared to the reference data (the one belonging to the selected category). The search of stored data is hence only partial. Though SRAM cells and comparators are grouped into blocks, there are no sub-blocks, no parallel searches per block, and only one match line per column. The match line does not perform any access control function.

A paper by G. J. Lipovski entitled "A Four Megabit Dynamic Systolic Associative Memory Chip", Journal of VLSI Signal Processing, Vol. 4, No. 1, pp. 37–51, 1992 (also U.S. Pat. No. 4,989,180 issued on Jan. 29, 1991), describes a means of storing CAM data in DRAM core cells, which share access to a comparator on a TDM (time division multiplex) basis. The entire contents of the CAM is searched in a single search operation, but the embodiment of this operation is most likely serialized by bit, rather than by word. Row access is controlled by a counter and address signals, rather than shift registers. The plurality of bits belonging to each word are all processed (compared) in the same comparator.

A paper by I. N. Robinson entitled "Pattern-Addressable Memory", IEEE Micro, pp. 20–30, June 1992, describes a structure in which CAM data are stored in DRAM cells, which share a comparator. Access is on a word-by-word basis and is normally performed in some pre-determined order. Rows are selected by address lines and decoders, as controlled by an "array controller", rather than deterministically by shift registers. There is a plurality of blocks on the chip, but each block contains a plurality of complete data words, and blocks are not sub-blocked. Match lines are confined to the "match engine" associated with each block, and do not run above DRAM cells.

U.S. Pat. No. 4,747,072 granted to I. N. Robinson et al. on May 24, 1988 discloses searching circuitry composed of a plurality of "retrieval processors", each with an associated bank of RAM. RAM access is controlled by a shift register, thus arbitrating access to the comparator resource in the processor. Although the access pattern, as controlled by the shift register, is sequential, it is not deterministic (fixed TDM). The processor, itself, may contain considerable circuitry in addition to the comparator, for the intended purpose of controlling the search for a sequence of entries, rather than a single isolated entry.

U.S. Pat. No. 4,794,559 granted to A. J. Greenberger on Dec. 27, 1988 discloses a means of achieving content-addressable functionality using standard DRAM storage array(s). Fixed TDM sharing of the comparator may be employed. Though the memory chip may be divided into separate blocks for the purpose of searching multiple words in parallel, these blocks are oriented such that only a single word line is asserted per cycle (said word line spans a plurality of blocks), and the match line is parallel to the word line, rather than parallel to the bit lines.

In a paper by K. J. Schultz et al. entitled "Architectures for Large-Capacity CAMs", INTEGRATION: the VLSI Journal, Vol. 18, pp. 151–171, 1995 describes, in a general tutorial fashion (pp. 158–161), an architecture employing multiple blocks being searched in parallel.

SUMMARY OF THE INVENTION

It is an object of the present invention to provide an improved content addressable memory (CAM).

In accordance with aspects of the present invention, there is provided a CAM, implemented with RAM core cells and comparators, the comparators being shared between a plurality of RAM cells on a sequential time-division-multiplexed (TDM) basis, the sequential TDM basis being a fixed one, a single clock cycle being used to perform multiple serial search operations, the number of which corresponds to the number of RAM cells sharing access to each of the comparators.

A plurality of metal layers are used to advantage, in conjunction with an architecture in which the memory is divided into a plurality of blocks, with match lines spanning multiple sub-blocks within a block, but not spanning multiple blocks. The match lines converge on a plurality of encoder circuits.

The multiple internal search cycles are performed transparently to the user, and do not require the application of a clock with a frequency any higher than that of the fundamental system clock, during a cycle of which the entire memory contents are searched.

BRIEF DESCRIPTION OF THE DRAWINGS

An embodiment of the present invention will now be described by way of example only with reference to the accompanying drawings in which:

FIGS. 11A and B are schematic diagrams of a self-timing circuitry associated with a block of the CAM;

Detailed Description

Figure 1:
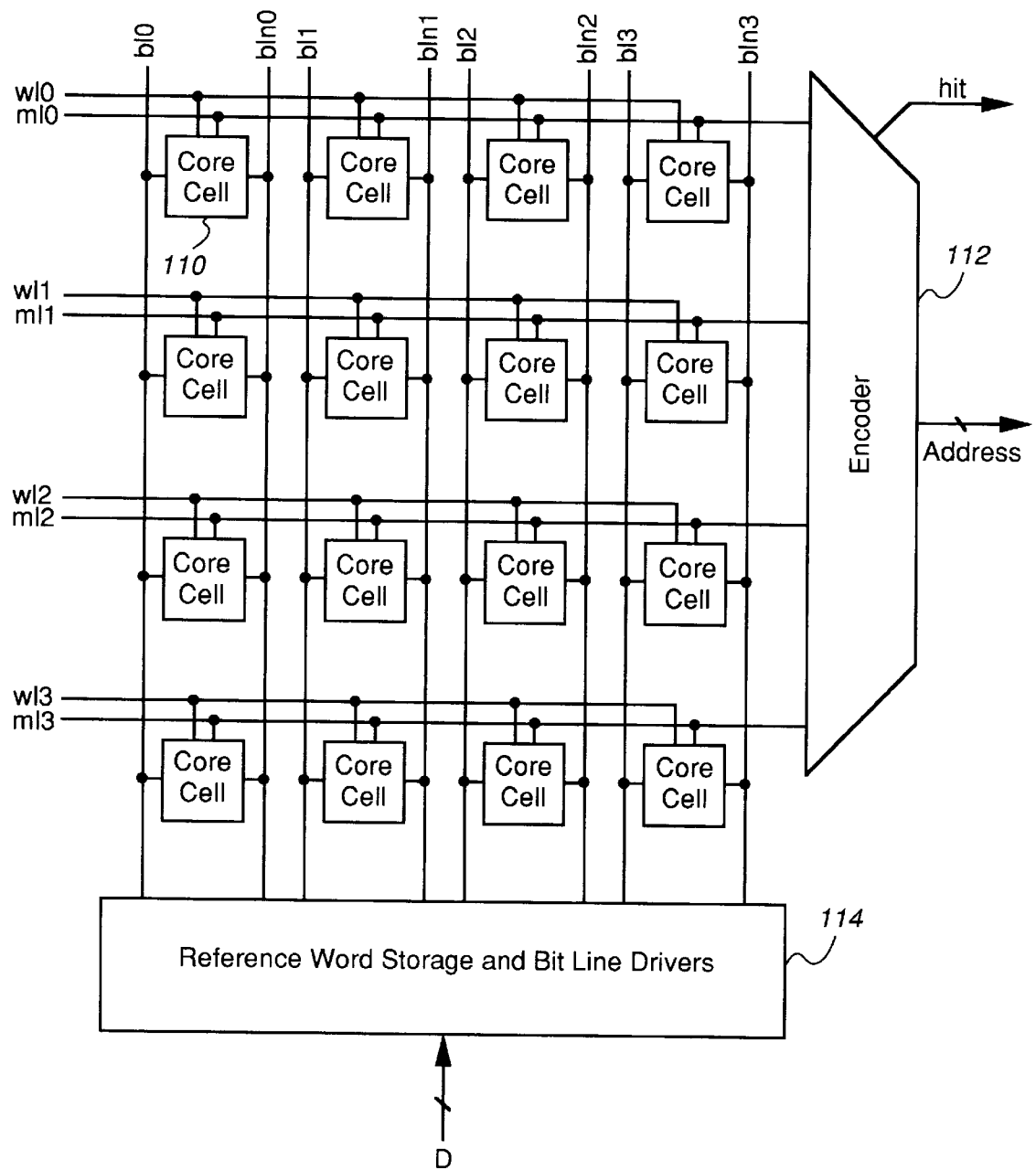
FIG. 1 is a block diagram of a prior art CAM.

FIG. 1 shows a prior art CAM. In FIG. 1, the CAM includes a 4 row by 4 column core cell array. The four core cells 110 of each row are connected to a respective word line wl0, wl1, wl2 or wl3 and a respective match line ml0, ml1, ml2 or ml3. The four match lines are connected to an encoder 112. The four core cells 110 of each column are connected to a pair of bit lines bl0, bln0; bl1, bln1; bl2, bln2; or bl3, bln3. The bit lines for differential data are connected to reference word storage and bit line drivers 114 which receive input data D for loading the contents of the CAM and for the search reference word. Data stored in the array's core cells are searched by applying a reference word on the bit lines. The match lines are pulled low by any mismatched bit to which they are connected. In rows where the reference data matches the stored data exactly, the match line remains high. The encoder 112 selects a single row in the case of multiple matches, and provides a hit signal along with the binary address of the selected row. That row can then be accessed for subsequent reads and writes. The hit signal is a binary signal indicating whether a match was found. See a paper by K. J. Schultz et al. entitled "Architectures for Large-Capacity CAMs", INTEGRATION: the VLSI Journal, Vol. 18, pp. 151–171, 1995, which is incorporated herein by reference.

CAMs of sufficient capacity for many functions are not possible due to density and architectural factors:

density—because one normally needs to include a one-bit comparator (XOR or XNOR gate) with each bit core cell;

architectural—because to do two-dimensional decoding (necessary to achieve a reasonable array aspect ratio for a large memory), there must be either (a) multiple words along a match line, or (b) multiple collinear match lines in a single physical row or column.

To solve the density problem, standard RAM core cells are used. The embodiment employs 6-transistor core cells, with one-bit comparators shared between multiple core cells.

To solve the architectural problem, used is a combination of:

TDM sharing of the comparator, to get 8 (more generally, s) cells along a match line, and a plurality of match lines running above a given core cell (generally, m; in the embodiment, 2), and a plurality of collinear match lines in each memory core column (generally, the number of blocks b divided by the number of lobes l, i.e.: b/l; in an embodiment, 4), and the product of m * (b/l) giving the number of match lines for each core column; this is 8 in the embodiment.

Figure 2:
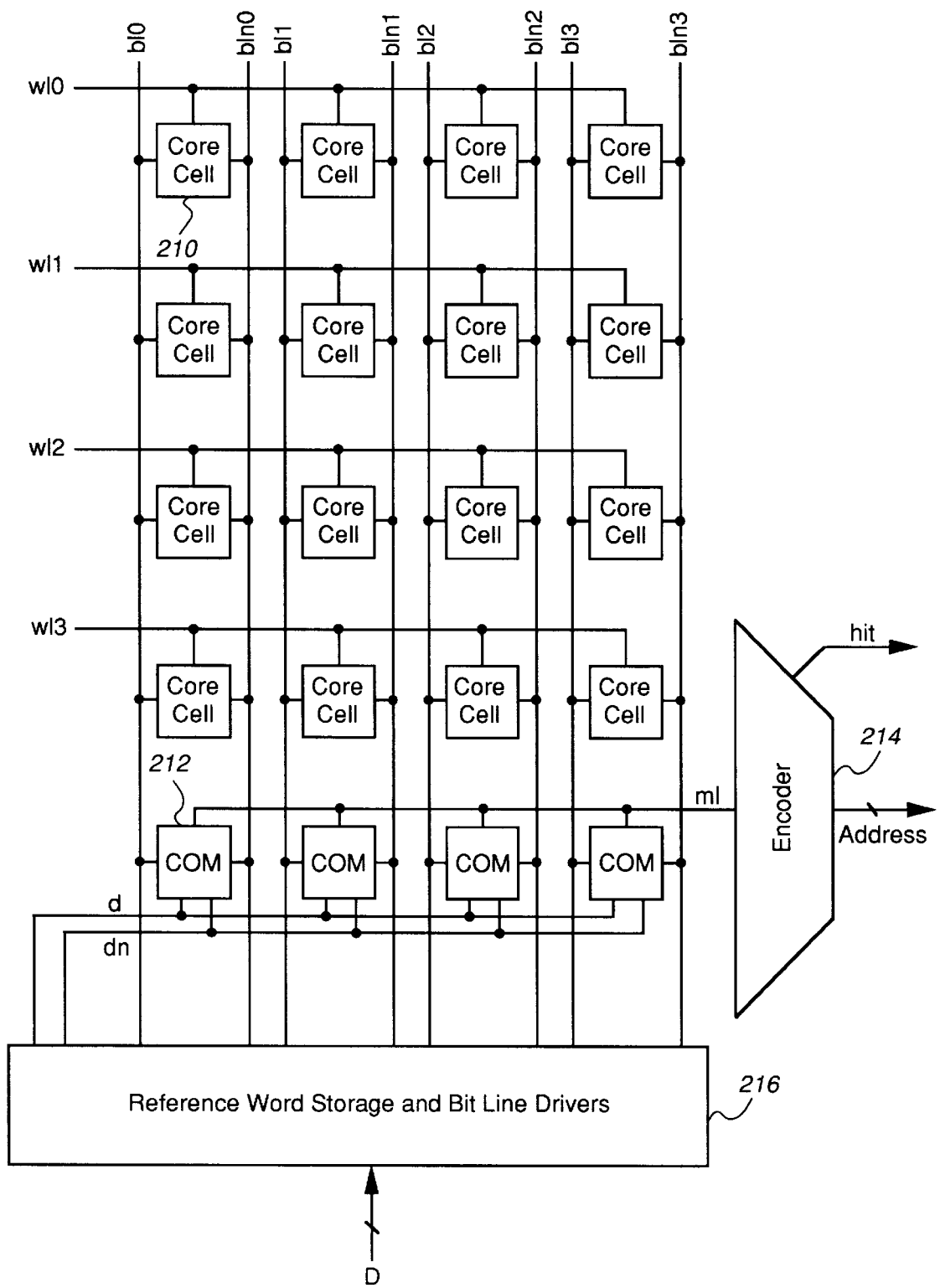
FIG. 2 is a block diagram of a CAM according to an embodiment of the present invention.

FIG. 2 shows a CAM according to an embodiment of the present invention. In FIG. 2, the CAM includes a 4 row by 4 column core cell array. The core cell 210 is a static random access memory (SRAM) cell. The four core cells 210 of each row are connected to a respective word line wl0, wl1, wl2 or wl3. The four core cells of each column are connected to a pair of bit lines bl0, bln0; bl1, bln1; bl2, bln2; or bl3, bln3. Each pair of the bit lines is connected to a respective comparator 212. The four comparators 212 are connected to a match line ml and a pair of data lines d and dn. The match line ml is connected to an encoder 214. The data lines and the bit lines for differential data are connected to reference word storage and bit line drivers 216 which receive input data D for loading the contents of the CAM and for the search reference word. Data is stored in one row of the array's core cells 210 by driving the data to be written onto the bit lines bl/bln from the bit line drivers 216, and asserting one of the four word lines wl.

Data stored in the core cell array is searched by storing the reference data in the reference word storage 216, and driving it onto the data lines d/dn. Subsequently, the four word lines wl0, wl1, wl2, and wl3 are asserted in sequence. The assertion of each word line wl causes the data stored in the core cells 210 of the accessed row to be read onto the bit lines bl/bln. The data on each bit line pair bl/bln are compared to the reference data on the data lines d/dn in the comparators 212. The match line ml is pulled low by any mismatched bit in any of the four comparators 212. If the reference data matches the stored data exactly, the match line remains high. It should be clear that a series of four operations (hereinafter referred to as "sub-cycles") is required to compare all of the data in the array of FIG. 2 to the reference data on d/dn, with one operation (sub-cycle) corresponding to the assertion of each word line wl. If this series of operations is performed as part of a single external clock cycle, the user perceives the search of the array as a single operation.

A plurality of match lines ml converge on the encoder 214, one match line from each array of core cells, such as the one represented in FIG. 2. In the case of at least one match line ml remaining high in a given sub-cycle, the encoder 214 selects a single match line (corresponding to a single core cell array), and provides a binary hit signal along with the binary address of the matched core cell array. This address may be combined with a knowledge of the number of the sub-cycle (corresponding to the number of the wl), to uniquely determine which individual row of core cells matched the reference data.

Note that the individual words of the CAM need not be organized as shown in FIG. 2, although they may. The preferred embodiment, described following, employs the plurality of core cells connected to each word line wl to store the same bit (of n) of different words. Words are oriented in columns, with one bit of each word in each array (hereinafter, "sub-block"), and the n bits of each word located in the n sub-blocks of each block, and the n bits of each word being compared in the same sub-cycle due to their connection to word lines which are activated in the same sub-cycle.

Figure 3:
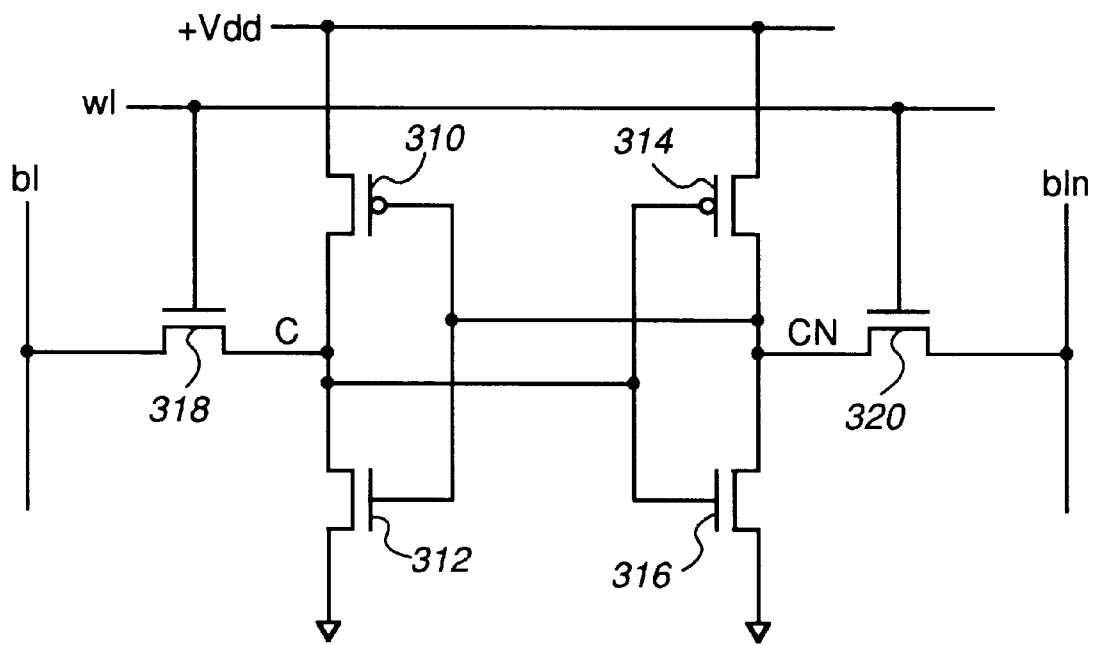
FIG. 3 is a circuit diagram of a cell shown in FIG. 2.

FIG. 3 shows a detail of the core cell 210 shown in FIG. 2. The core cell is a well known SRAM storage element which includes two CMOS inverters. In FIG. 3, the drains of a P-channel FET 310 and an N-channel FET 312, which define one CMOS inverter, are connected to the gates of a P-channel FET 314 and an N-channel FET 316, which define the other CMOS inverter. Similarly, the drains of the FETs 314 and 316 are connected to the gates of the FETs 310 and 312. The sources of the FETs 310 and 314 are connected to the voltage terminal of the supply voltage+Vdd. The sources of the FETs 312 and 316 are connected to the ground terminal. The junction (node C) of the drains of the FETs 310 and 312 is connected to source of an N-channel FET 318, the drain of which is connected to the bit line bl. The junction (node CN) of the drains of the FETs 314 and 316 is connected to the drain of an N-channel FET 320, the source of which is connected to the bit line bln.

Figure 4:
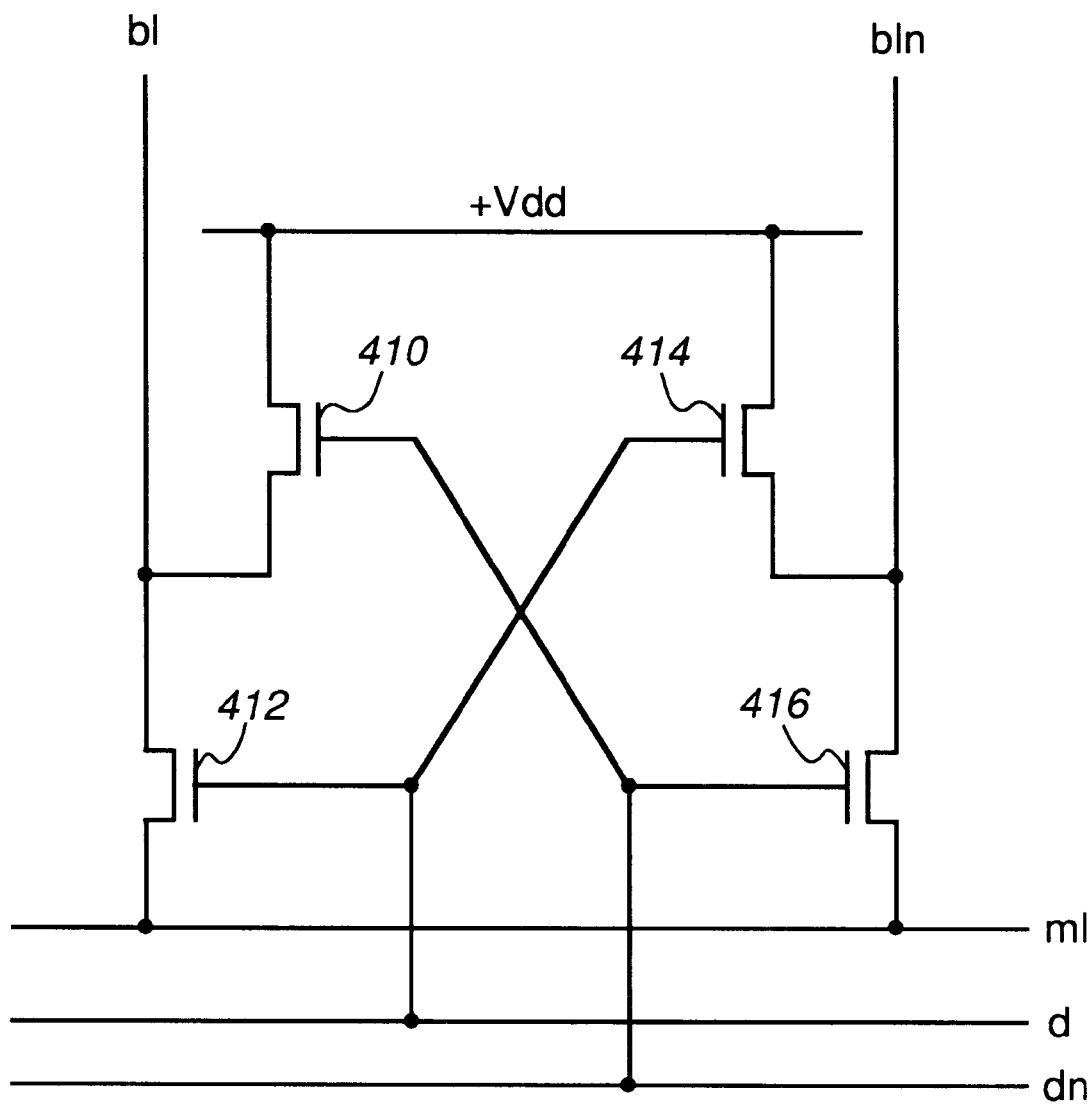
FIG. 4 is a circuit diagram of a comparator shown in FIG. 2.

FIG. 4 shows a detail of a possible embodiment of the comparator 212 shown in FIG. 2. In FIG. 4, the sources of N-channel FETs 410 and 412 are connected to the bit line bl. The sources of N-channel FETs 414 and 416 are connected to the bit line bln. The drains of the FETs 410 and 414 are connected to the voltage terminal of the supply voltage+Vdd. The drains of the FETs 412 and 416 are connected to the match line ml. The gates of the FETs 410 and 416 and the gates of the FETs 414 and 412 are connected to the pair of data lines d/dn.

Figure 5:
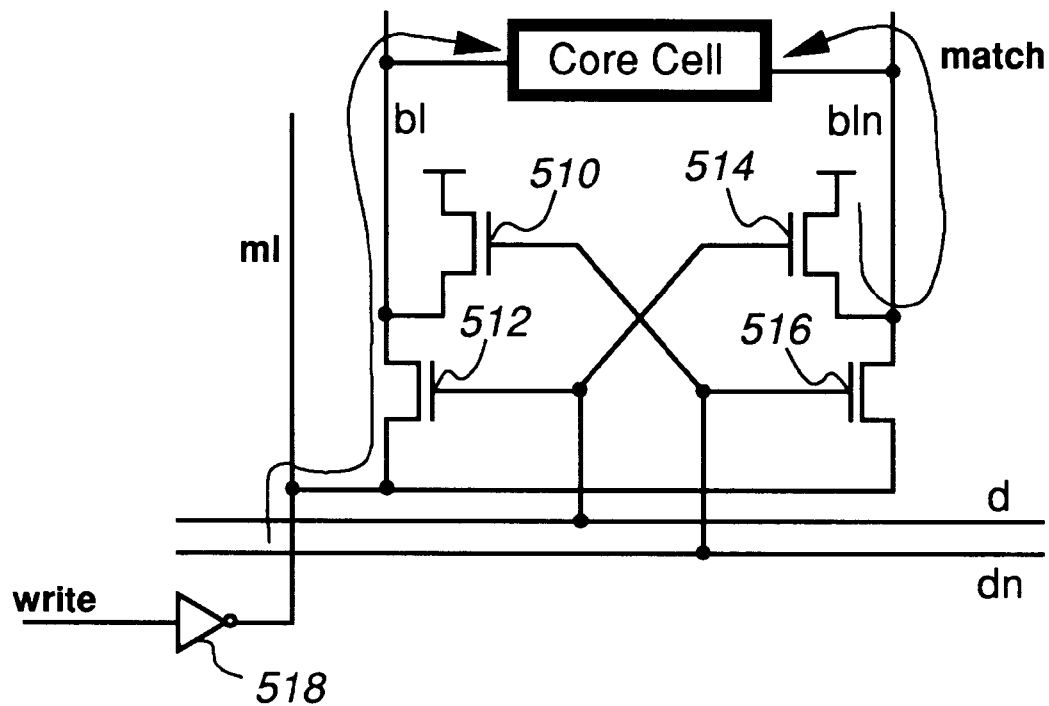
FIG. 5 is a schematic diagram of a comparator and a cell and shows data compare.

FIG. 5 shows a detail of the 4-transistor comparator of FIG. 4, the 4-transistors being four N-channel FETs 510–516. Also, FIG. 5 shows one of the core cells (an instance of 210 from FIG. 2) and an inverter 518 used to control the match line ml. During a search operation, the write signal will be logically low, and the match line ml will be high (at or neat the positive supply+Vdd). Also during a search, one of the lines d/dn will be asserted high, while the other will be held low. At the same time, the core cell will draw current from either bl or bln, with the current drawn from bl if the stored data is a logical "0", and drawn from bln if the stored data is a logical "1". FIG. 5 shows current being drawn from both bl/bln for illustrative purposes, only.

FIG. 5 assumes that the data line d has been asserted high, and dn is being held low. If the core cell is drawing current from bln, the stored data matches the reference data, and the match line must be unaffected by the comparator. In this case, the FET 514 sources the necessary current drawn by the core cell. If the core cell is drawing current from bl, the stored data mismatches the reference data, and the match line must be discharged. This occurs through the FET 512, as shown. In the event of a match of the opposite polarity, the FET 510 would source current through bl to the core cell. In the event of a mismatch of the opposite polarity, the FET 516 will conduct current from the match line ml to the bit line bln.

This circuit shown in FIG. 5 is also active in a write operation. During such an operation, the write signal is logically high, and as a result, the match line ml is pulled low. The data logically opposite of that to be written is driven onto the lines d/dn. To write a logical "1" to the core cell, dn is high, the FET 510 holds bl high, and the FET 516 pulls bin low. To write a logical "0" to the core cell, d is high, the FET 514 holds bin high, and the FET 512 pulls bl low.

It is recognized that numerous extensions to the circuit of FIG. 5 are obvious to anyone skilled in the art, including, but not limited to, an implementation with P-channel FETs, more complicated driver circuitry on ml, or sense circuitry inserted between the 4 transistors and the match line ml.

Figure 6:
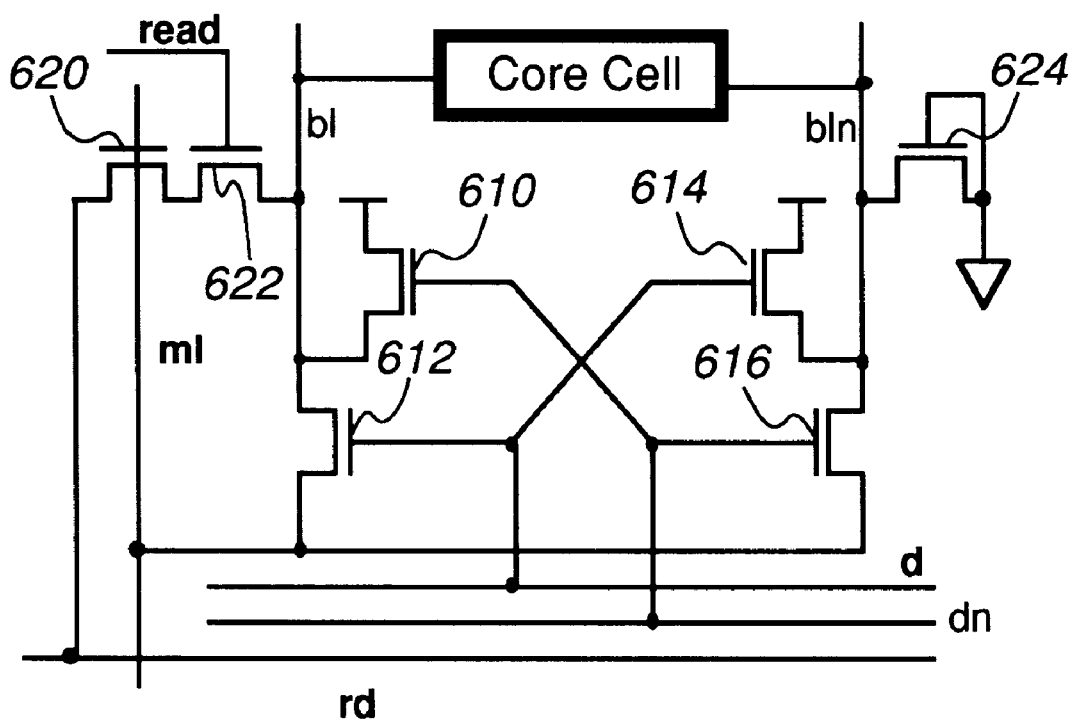
FIG. 6 is a schematic diagram of a comparator and a cell and shows data read.

FIG. 6 shows a detail of the comparator of FIGS. 4 and 5, further augmented with three additional FETs and two signal lines (read and rd) to enable a read operation. The FETs are N-channel FETs 610–616 and 620–624. The signal line rd (or read data line) runs in parallel with the differential d/dn lines. The read signal must be bussed in some manner to all comparator structures, such as the one shown in FIG. 6, on the memory chip. A read is initiated by asserting a word line (not shown in FIG. 6), which enables the data stored in the core cell to be passed to the bit lines bl/bln. Also as part of the operation, the read signal is asserted, turning on the FET 622. Note that the FET 624 is intended to provide an even load on bl/bln; it may be implemented as shown, replaced by other circuitry with the same function, or omitted entirely. The match line ml will be asserted at comparators associated with a selected (addressed) word, and the single-ended data on bl will be passed through the series the FETs 622 and 620 to the line rd.

Figure 7:
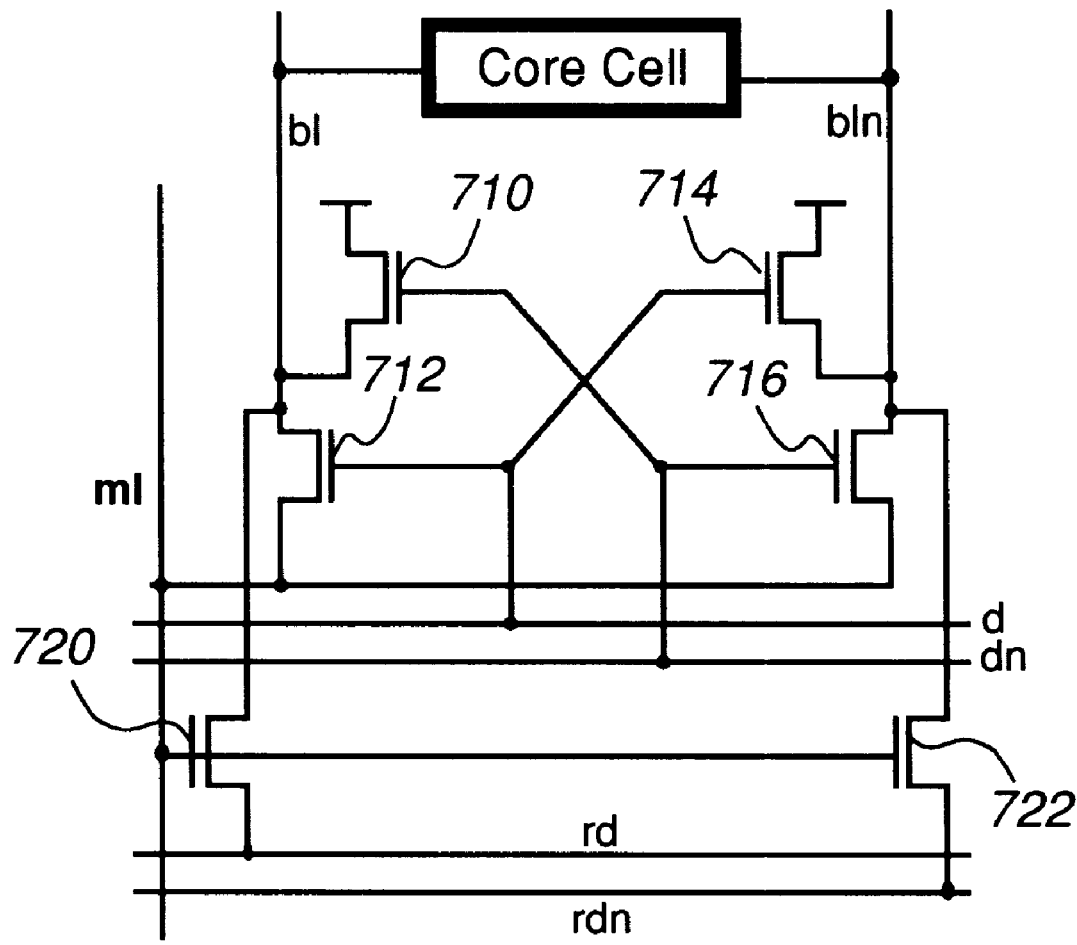
FIG. 7 is a schematic diagram of another example of a comparator and a cell and shows data read.

FIG. 7 shows a detail of the comparator augmented in an alternative manner to implement read functionality. Here, two additional data lines rd/rdn are employed, along with two additional FETs, but no additional control signals. The FETs are N-channel FETs 710–716 and, 720 and 722. During a read operation, a word line is asserted, and core cell data is passed onto bl/bln, in the same way as in the description of the previous figure. Also as in the previous figure, a match line ml is asserted high to select a comparator circuit for data transfer onto the read data line, which in this case is differential (rd/rdn). Read data is passed differentially onto rd/rdn through the FETs 720 and 722, and the differential nature of the read operation tends to achieve more noise immunity, in addition to a higher speed or lower power operation. The disadvantage of the implementation shown in FIG. 7 is that, with all match lines ml at a logical high value during a search operation, the state of the read data lines rd/rdn will have an effect on the bit lines bl/bln.

Figure 8:
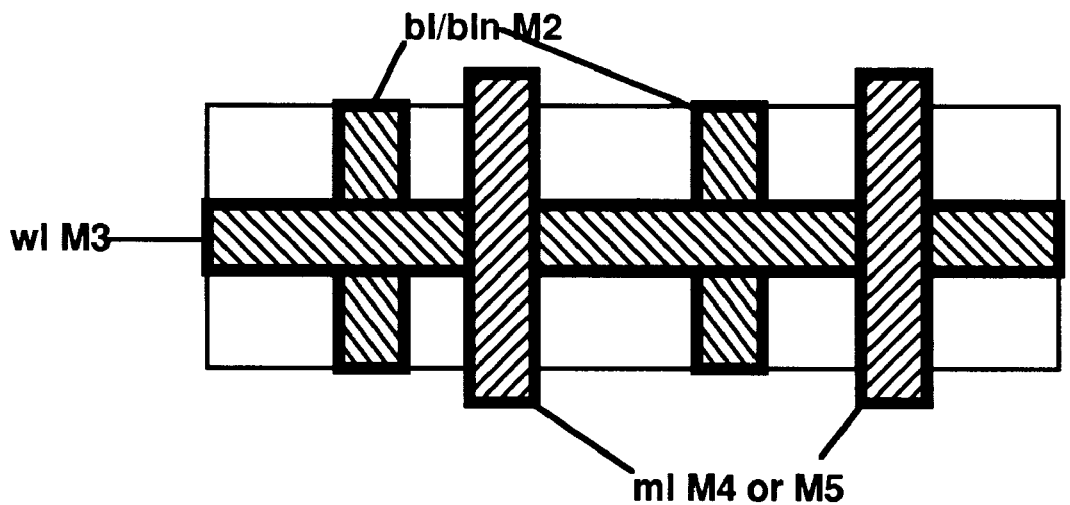
FIG. 8 is a plan view of a core cell metal.

FIG. 8 shows a view of the metal layers present in (or above) each core cell. Layers of second metal and higher are shown. The transistors employed to store and access a bit of information are beneath these layers. The comparator function is not performed in this core cell. Power buses are not shown, for simplicity. FIG. 8 may be compared to FIG. 3 to appreciate the way in which the core cell fits into the architecture. The bit lines bl/bln run vertically in second layer metal. The word line wl runs horizontally in third layer metal. The match lines do not make connection with the core cell, and hence are not shown in FIG. 3. However, they are required to run above the core cells in fourth layer metal. In FIG. 8, 2 match lines are shown; more generally, the parameter m represents the number of match lines running above each core cell. While we believe the choice of layers shown in FIG. 8 is the optimum for most 4 or 5 layer technologies, it is obvious that the concept extends to any rearrangement and reassignment of the layers, or to the use of layers above the fourth layer of metal.

Figure 9:
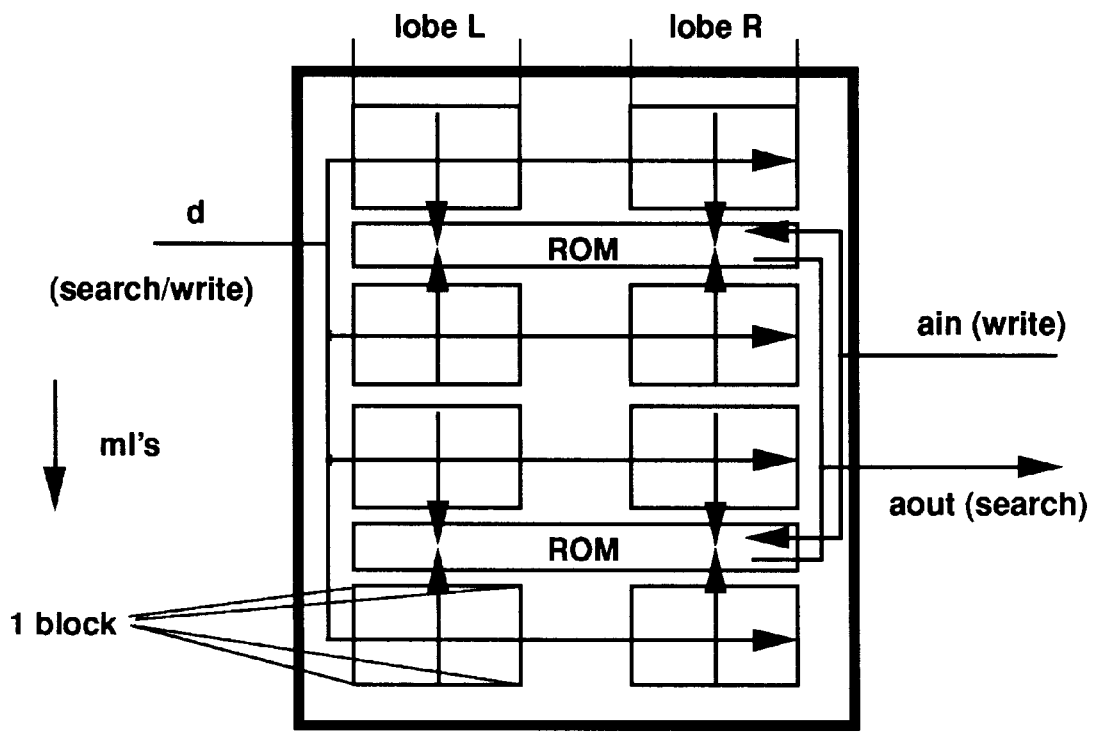
FIG. 9 is a schematic diagram of a CAM chip.

FIG. 9 shows a block diagram of the entire chip, in the embodiment. The data bus d may be single-ended or differential; the latter implementation has been chosen for the previous detailed figures. The data bus d may use the same physical pins and bus for both search and write functions, or the search function may be supported through a "search port", and the write function through a "processor port". The processor port, if provided, may or may not also have read capability, using the ain bus shown, and a q bus (not shown). The purpose of aout is to provide to the user the physical address where the searched-for data resides; this is the result of the search operation. It may be observed that the search thus accomplishes an address compression function, from the bit width of d to the bit width of aout.

The chip, in the embodiment shown in FIG. 9, has a total of 8 blocks, divided into 2 lobes (L and R), each of these aligned vertically. Two blocks (more generally, m blocks) aligned horizontally and belonging to different lobes, share the same physical d bus (36 bits wide, in the case of the embodiment). Each block has 512 (more generally, c) columns and 1024 (more generally, m*c) match lines. Four blocks have their match lines, 4096 (more generally, 2*1*c*m) in total number, converge on each ROM, where an encoding to 12 bits of aout takes place. One of the 2 ROMs is selected, this selection providing a 13th bit of aout, resulting in an encoding of 8K unique match lines.

The 8K match lines are TDM-shared in a deterministic sequence of 8 (more generally, s) internal cycles. A counter in conjunction with the encoding circuitry produces an 8-to-3 (more generally, s-to-$\log_2(s)$) encoding of this timing information, resulting in a total 64K-to-16 bit address encoding to aout. To deal with the possible occurrence of a plurality of match lines remaining logically high, indicating that more than one entry in the CAM is identical to the searched-for data, multiple match detection and/or resolution capability may or may not be provided.

Figure 10B:
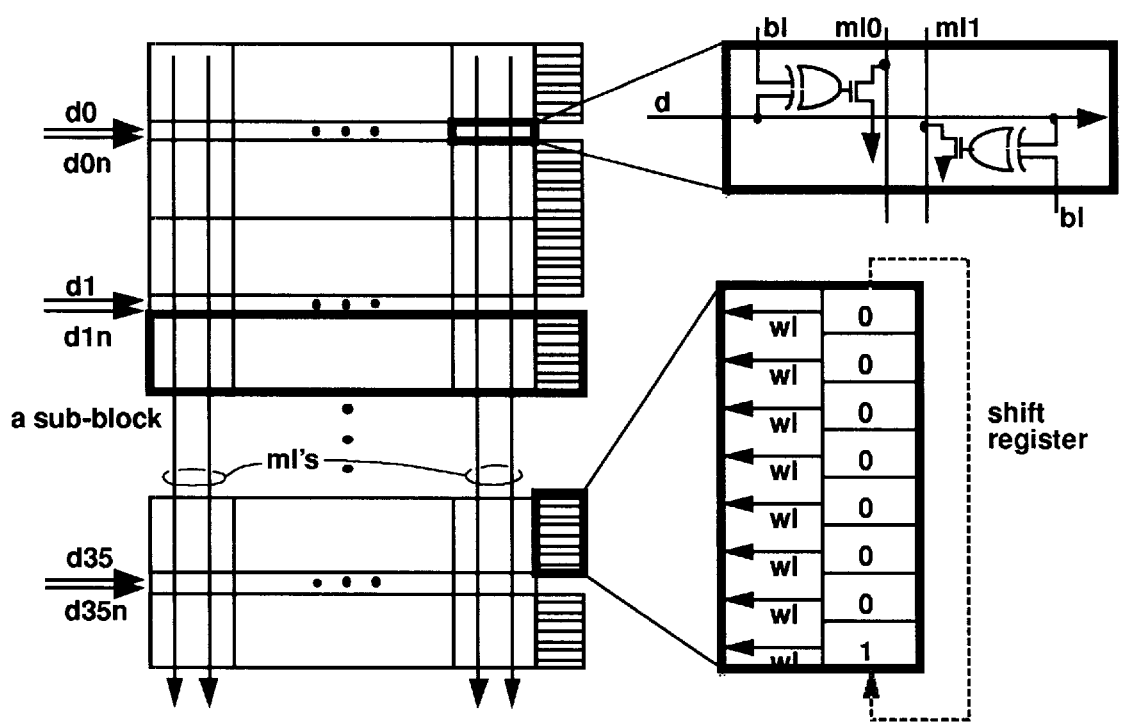
FIGS. 10 A–C are schematic diagrams of a single block.

Each block is divided into 36 (more generally, n) sub-blocks, one per bit of d, as shown in FIGS. 10 A–C. The conceptual view of XOR gates and pull-downs, shown in the upper right portion of FIGS. 10 A–C, corresponds to 2 instances of the comparator circuit shown in previous figures.

As shown, each of the 2 (more generally, m) match lines per column per block has one pull-down per sub-block (equivalently, one pull-down per bit), for a total of n pull-downs per match line.

Each sub-block has 16 rows of cells (more generally, m * s), with 8 (more generally, s) rows associated with each match line.

Control of row-access, through word line (wl) assertion, is by 8-bit (more generally, s-bit) circulating shift registers, implementing 8-way (more generally, s-way) TDM sharing of the comparators. The row number selected by each shift register is the same, and this row number is coordinated to be the same as the counter value, held in the encoder's 3-bit counter mentioned above.

During write and read operations, the word lines are not controlled by the shift registers, but instead by a standard row decoder, which is physically located in the central spine between the two lobes, and may be shared between horizontally adjacent blocks. There is a plurality of instantiations of the identical 3-to-8 (more generally, $\log_2(s)$-to-s) decode function in this spine, either m/2*n*b in number, if the function is shared between horizontally adjacent blocks, or m*n*b if it is not so shared.

The total number of core cells in the horizontal (y) dimension is 512 columns/lobe*2 lobes=1024 columns (more generally, c*l). This corresponds to 1 column/8 match lines*8K match lines=1024 columns.

The total number of core cells in the vertical(x) dimension=s*m rows/sub-block*n sub-blocks/block*b/2 blocks=s*m*n*(b/l) rows. This equals 8*2*36*8/2=2304 rows in the embodiment.

The number of columns per lobe, or columns per block, can thus be calculated as w/(s*m*b), where w is the number of words in the CAM.

In write and read operations, the match lines will be driven outward from the ROMs, accomplishing their second function as outputs of 13-to-8K decoders (more generally $\log_2(w/s)$-to-w/s decoders). The 13-bit input is a 13-bit field of ain, and the remaining 3 bits of ain are the bits driven to the multiple 3-to-8 (more generally, $\log_2(s)$-to-s) word line decoders in the spine, as described above.

The TDM sharing is hidden from the user. All 8 (more generally, s) serial operations occur during one externally-supplied clock cycle, and it appears to the user as a single-cycle operation. The s internal cycles are self-timed, using an internal timing loop, such that one cycle begins immediately after the previous cycle has completed. The self-timing mechanism may be realized with the circuitry shown, for a single block, in FIGS. 11A and B.

As shown in FIGS. 11A and B, the top-most sub-block of each block has its shift register and word line driver circuitry augmented by a driver for a model word line mwl, which is asserted every sub-cycle, regardless of the state of the shift register. This model word line mwl passes over the width of the block, as shown. It then continues in a vertical dimension toward the ROM. Upon reaching the bottom of the block, it is redirected horizontally, before it performs its function as the clock for the match line amplifiers. These amplifiers may be single-ended or differential; they may have a reference input supplied from a single or multiple paths or sources; and they may operate on voltage or current mode principles. The model word line, as it is routed both horizontally and vertically, may or may not be loaded in such a way as to emulate load on an actual word line or match line. It may also be buffered, as required.

Figure 12:
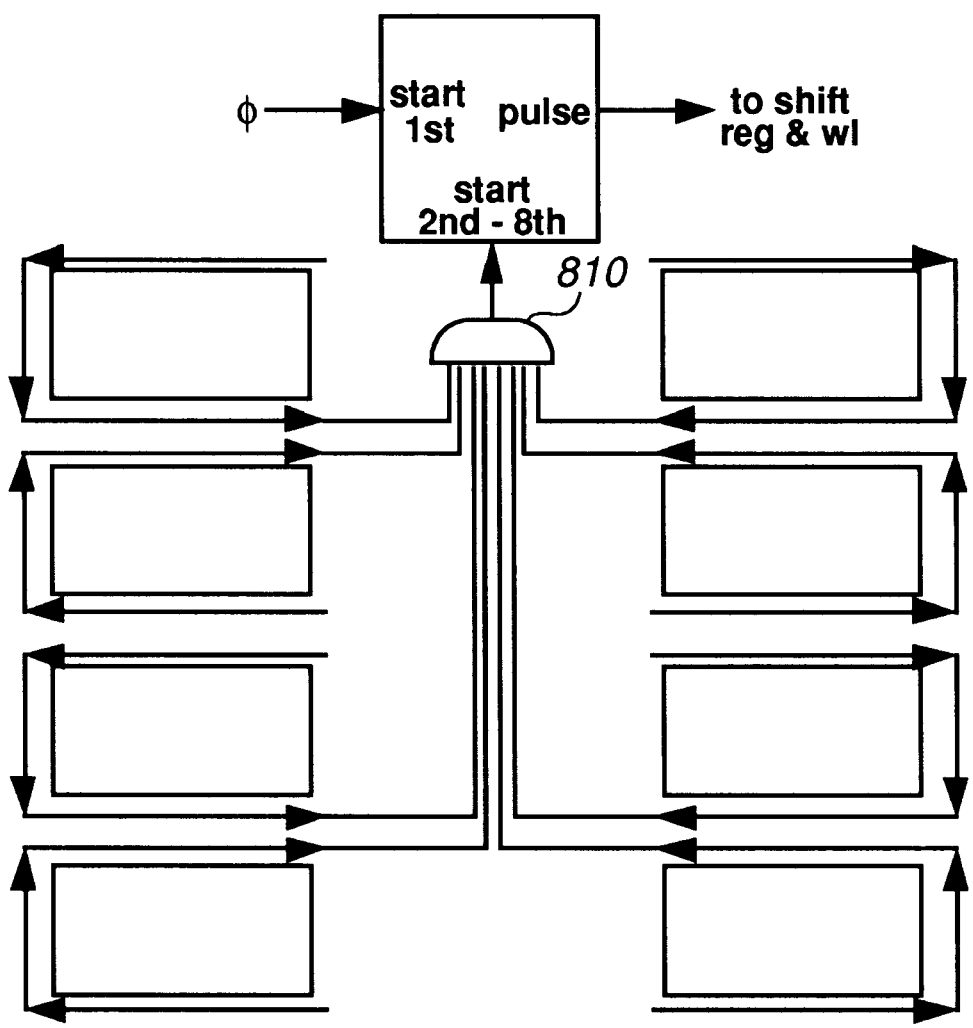
FIG. 12 is a schematic diagram of the entire chip associated with self-timing circuitry.
Figure 13:
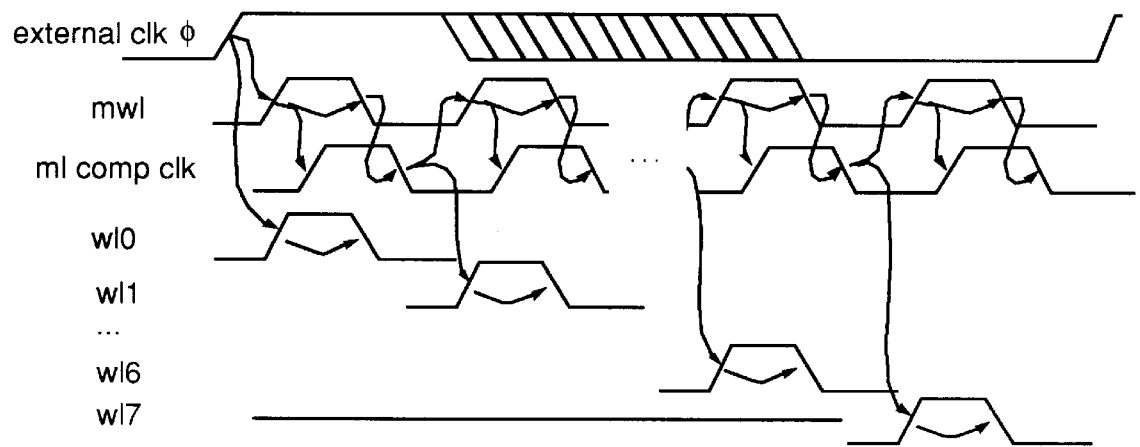
FIG. 13 is a timing chart of the internal operation of the CAM.

FIG. 12 shows how the model word lines mwl, further acting as match line amplifier clocks, are combined to create a timing source for sub-cycles 2 through 8 (sub-cycle 1 is initiated by the system clock). When all of the model/clock signals have made positive transitions, the output of an AND gate 810 is asserted, and the next sub-cycle begins. Alternatively, the next sub-cycle may be initiated after the first falling edge of any of the model/clock signals. This latter mechanism is demonstrated in the timing diagram of FIG. 13.

Note that it is not necessary that the time interval associated with each sub-cycle be sufficient to allow the ROM encoding operation to complete. If necessary, the outputs of the match line amplifiers may be latched on the falling edge of their clock, and the actual ROM encoding function may be pipelined into the following sub-cycle.

Self-timing has the following advantages:
 Internal serialization of the function is hidden from the user, who needs only to apply the slower system clock to the chip.
 Simple integration with self-timed embedded memory architectures (see co-pending United States patent Application entitled "Multi-Port RAM" filed by G. F. R. Gibson on May 9, 1996, which claims priority from U.S. provisional Application Ser. No. 60/001,856 filed on Aug. 3, 1995, which is incorporated herein by reference).
 Easy binning of parts during at-speed test—increase the system clock frequency until the part fails.

In write and read operations, a full external cycle is used for the operation; from an internal chip viewpoint, this operation is relatively slow.

Power considerations must be addressed in the circuit design, since standard memory design power reduction techniques such as blocking and selective activation cannot be employed due to the nature of the operation—the entire contents of the memory must be searched in one external clock cycle. Some possible circuit design guidelines are now summarized.

To perform a search, the data in the core cell selected by the shift register is first read onto the local bit lines bl/bln. The core cell transistors in FIG. 3 numbered 312, 318, 316, and 320 and transistors 410, 412, 414, and 416 of FIG. 4 must be sized such that the current sunk through the core cell is precisely supplied either from the match line ml through 412 or 416 (in the case of a comparison mismatch) or from 410 or 414 (in the case of a match). This prevents the voltage on the bit lines bl/bln from drooping, and removes the need for a precharge phase of the search sub-cycle. The current should be very small, and it is likely that minimum-sized devices will be used in this path. Current may be further reduced by using an N-channel pull-up FET on the word line wl during searches.

It is also important that the voltage level on the match lines does not droop, to avoid the need to precharge these nodes. This is a challenging circuit design task, since the match line voltage should remain relatively constant, while currents anywhere between 0 times and n times the single-cell read current are sourced from a single match line.

Sensing, to determine whether a match line ml is logically "high" or "low", may be performed with a differential current sensing circuit. The reference current would in this realization be approximately one-half of a cell read current, and may be generated by an additional model (or "dummy") match line. It may be mirrored for input to multiple current comparators.

As mentioned above, match lines perform the dual functions of sensing matches during a search operation, and of selecting words for write and read operations. Based on the circuit of FIG. 5, a write decode requires that 1 of 8K match lines be asserted low to select 8 words, while 1 of every 8 word lines is asserted high. A more general statement of these conditions follows:

Match lines are used for selection of a unique CAM word, possibly in conjunction with the assertion of one or more word lines. A unique decoding is not necessarily accomplished by either the match lines alone (though it may be), nor the word lines alone, but by their combined effect. A fraction 1/M of the memory is selected by the match lines (one or more in actuality being asserted), and the fraction 1/W of the memory is selected by the word lines (one or more in actuality being asserted), such that their unique intersection, 1/WM, accomplishes a full decoding of a WM-word CAM for reading or writing operations. It is possible that W=1 in the above explanation.

A read function may be added to the same basic circuit, using either of the circuits shown in FIGS. 6 and 7.

Any transistor-level embodiment of this CAM architecture which involves voltage-mode match sensing is a relatively straightforward extension of the information presented herein, and should be obvious to anyone skilled in the art.

A design alternative for higher throughput would be to TDM share only 4 ways, and provide one comparator for every 4 RAM cells. This will approximately double power dissipation, as well as increasing chip area. It may be a legitimate "high-performance" implementation option.

There are several features that may be added to provide extended functionality:

The ROM and other encoding circuitry may be augmented by circuitry capable of detecting the condition of multiple match lines remaining high, or the logically equivalent occurrence of multiple match lines remaining high among the s sub-cycles that comprise a search operation.

Insofar that the above multiple match functionality may be too expensive to provide, provide instead (at the user's option) a two-cycle write operation, wherein:
the first cycle is actually a search operation to determine whether the data to be written already exists in the memory, leading to abortion of the write operation if this is found to be the case, and
the second cycle, if allowed to complete, is the actual write operation.

One of the bits in the n-bit word may be a "valid/emptyn" bit, which may be reset to zero in all word locations of the CAM in a single operation. This ensures that all data present in the memory at power-up is incapable of matching any searched-for data. All successful searches will require that "valid/emptyn"=1.

Additional RAM storage (with an output bus denoted qram) may be provided on-chip in a separate array, addressable by the aout bus, most likely with one pipeline cycle delay between the outputs of aout and qram.

Although particular embodiments of the present invention have been described in detail, it should be appreciated that numerous variations, modifications, and adaptations may be made without departing from the scope of the present invention as defined in the claims.

What is claimed is:

1. A method of providing two-cycle write operation to a content addressable memory (CAM) comprising an array of core cells for data storing, the method comprising the steps of:

performing a search operation during the first cycle, to determine whether the data to be written already exists in the CAM;

aborting the write operation if the data is found to already exist; and performing a write operation during the second cycle, if it is allowed to complete.

\* \* \* \* \*